(12) United States Patent
Kim

(10) Patent No.: US 6,594,363 B1
(45) Date of Patent: Jul. 15, 2003

(54) AUDIO APPARATUS FOR REDUCING WHITE NOISE AND CONTROL METHOD OF THE SAME

(75) Inventor: Yang-Sung Kim, Suwon (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/407,373

(22) Filed: Sep. 28, 1999

(30) Foreign Application Priority Data

Sep. 28, 1998 (KR) ........................................ 1998-40365

(51) Int. Cl.[7] ............................................... H04R 29/00
(52) U.S. Cl. ...................................................... 381/58
(58) Field of Search ........................ 381/58, 119, 94.5, 381/77, 111–115; 700/94

(56) References Cited

U.S. PATENT DOCUMENTS

| | | | |
|---|---|---|---|
| 4,531,095 A | | 7/1985 | Ishigaki et al. |
| 5,323,457 A | * | 6/1994 | Ehara et al. ................. 375/346 |
| 5,640,450 A | | 6/1997 | Watanabe |
| 5,794,057 A | | 8/1998 | Lada, Jr. |
| 5,907,622 A | | 5/1999 | Dougherty |
| 6,007,228 A | * | 12/1999 | Agarwal et al. ............ 361/683 |

* cited by examiner

Primary Examiner—Forester W. Isen
Assistant Examiner—Brian Pendleton
(74) Attorney, Agent, or Firm—Robert E. Bushnell, Esq.

(57) ABSTRACT

An audio apparatus for reducing white noise automatically detects when a microphone is connected, and when the microphone is not connected, to a microphone input jack. If the microphone is not connected to the microphone input jack, microphone input of the audio apparatus is automatically muted to reduce white noise.

20 Claims, 5 Drawing Sheets

AUDIO APPARATUS FOR REDUCING WHITE NOISE AND CONTROL METHOD OF THE SAME

CLAIM OF PRIORITY

This application makes reference to, incorporates the same herein, and claims all benefits accruing under 35 U.S.C. §119 from an application entitled AUDIO APPARATUS WITH REDUCING WHITE NOISE AND CONTROL METHOD OF THE SAME earlier filed in the Korean Industrial Property Office on the 28$^{th}$ day of September 1998, and there duly assigned Ser. No. 98-40365, a copy of which is annexed hereto.

BACKGROUND OF THE INVENTION

1. Technical Field

The present invention relates to an audio apparatus, and more particularly to an audio apparatus such as a sound card mounted in a computer system and a method of the same.

2. Related Art

Computer systems are information handling systems that are utilized by many individuals and businesses today. A computer system can be defined as a microcomputer that includes a central processing unit (CPU), a volatile memory, a non-volatile memory such as read only memory (ROM), a display monitor, a keyboard, a mouse or other input device such as a trackball, a floppy diskette drive, a compact disc-read only memory (CD-ROM) drive, a modem, a hard disk storage device, and a printer. A computer system's main board, which is a printed circuit board known as a motherboard, is used to electrically connect these components together. A computer system can be a desktop computer, a personal computer, a portable computer such as a notebook computer or palm-sized computer, or other type of computer.

The semiconductor technology has been rapidly advanced over the last decade. This allows much data of a semiconductor device such as a central processing unit (CPU) mounted in a computer system to be processed at high speed. As capabilities of computer systems have been improved, application programs installed in the computer systems also have been developed.

Furthermore, developing capabilities of computer systems enable audio and video data comprising relatively large amounts of data to be processed at high speeds. Some computer systems incorporate microphones inputting audio data and speakers outputting audio data.

I have found that audio-related features can be modified to improve the quality thereof. Efforts have been made to improve audio-related features.

Exemplars of recent efforts in the art include U.S. Pat. No. 5,907,622 for AUTOMATIC NOISE COMPENSATION SYSTEM FOR AUDIO REPRODUCTION EQUIPMENT issued to Dougherty, U.S. Pat. No. 5,794,057 for CIRCUIT FOR REDUCING AUDIO AMPLIFIER NOISE DURING POWERING ON AND OFF issued to Lada, Jr., U.S. Pat. No. 5,640,450 for SPEECH CIRCUIT CONTROLLING SIDETONE SIGNAL BY BACKGROUND NOISE LEVEL issued to Watanabe, U.S. Pat. No. 5,323,457 for CIRCUIT FOR SUPPRESSING WHITE NOISE IN RECEIVED VOICE issued to Ehara et al., and U.S. Pat. No. 4,531,095 for IMPULSE NOISE REDUCTION BY LINEAR INTERPOLATION HAVING IMMUNITY TO WHITE NOISE issued to Ishigaki et al.

While these recent efforts provide advantages, I note that they fail to adequately provide an improved audio apparatus for reducing white noise and control method of the same.

SUMMARY OF THE INVENTION

It is an object of the present invention to provide an audio apparatus for reducing white noise.

It is a further object of the present invention to provide a method controlling the aforementioned audio apparatus reducing white noise.

According to a feature of the present invention, an audio apparatus mounted on a computer system comprises a microphone connection means, an audio chipset including an interface for data input/output with the computer system, an audio function circuit, a mixer for mixing a plurality of audio signals, and a general purpose input/output (GPIO), and a microphone detection means inputting a detection signal to an input terminal of the general purpose input/output. Here, the detection means is accordance with a state that a microphone is connected to the microphone connection means.

In the preferred embodiment, the microphone detection means comprises a first resistance whose one edge is connected to the microphone connection means, a transistor whose base is connected to the other edge of the first resistance and one edge of a current path is connected to power supply voltage $V_{DD}$, and a second resistance connected between the other edge of the current path and ground voltage $V_{ss}$.

According to another feature of the present invention, a computer system with an audio apparatus comprises a microphone connection means, an audio chipset including an interface for data input/output with the computer system, an audio function circuit, a mixer for mixing a plurality of audio signals, and a general purpose input/output (GPIO), a microphone detection means inputting a detection signal to an input terminal of the general purpose input/output, the detection means according to a state that a microphone is connected to the microphone connection means, and a means exerting microphone mute function of the mixer, if a microphone is connected to the microphone connection means when determining a voltage level of an input terminal of the general purpose input/output where a detection signal supplied from the microphone detection means is inputted.

According to further feature of the present invention, a method for controlling an audio apparatus mounted on a computer system comprises the steps of: determinating whether a microphone connection detector detects a microphone being connected to the audio apparatus; enabling microphone volume control function, if the microphone is connected to the audio apparatus; and enabling microphone mute function of a mixer mounted in on the audio apparatus, if the microphone is not connected to the audio apparatus.

To achieve these and other objects in accordance with the principles of the present invention, as embodied and broadly described, the present invention provides an apparatus, comprising: a terminal being removably coupled to a microphone; a detector detecting when the microphone is coupled to said terminal and outputting a detection signal in accordance with said detecting; a mixing unit receiving first audio data through said terminal and outputting second audio data; and a control unit controlling said mixing unit in accordance with said detection signal, muting the first audio data when the microphone is not coupled to said terminal, not muting the first audio data when the microphone is coupled to said terminal.

To achieve these and other objects in accordance with the principles of the present invention, as embodied and broadly described, the present invention provides an apparatus, comprising: a terminal being removably coupled to a microphone; a detector detecting when the microphone is coupled to said terminal; and a mixing unit receiving first audio data through said terminal and outputting second audio data, said mixing unit muting the first audio data when said detector detects that the microphone is not coupled to said terminal, said mixing unit not muting the first audio data when said detector detects that the microphone is coupled to said terminal.

To achieve these and other objects in accordance with the principles of the present invention, as embodied and broadly described, the present invention provides an audio apparatus mounted on a computer system, comprising: a connector removably coupling a microphone to a terminal; a detector detecting when the microphone is coupled to said connector and outputting a detection signal in accordance with said detecting; a mixing unit receiving first audio data through the terminal and outputting second audio data; and a control unit controlling said mixing unit in accordance with said detection signal, said control unit preventing the first audio data from being included with the second audio data when said detection signal indicates that the microphone is not coupled to said connector, said control unit not preventing the first audio data from being included with said second audio data when said detection signal indicates that the microphone is coupled to said connector.

To achieve these and other objects in accordance with the principles of the present invention, as embodied and broadly described, the present invention provides a method, comprising: detecting when a microphone is coupled to an audio apparatus; when the microphone is detected as being coupled to the audio apparatus, enabling a microphone volume control function to include first audio data with output audio data output from the audio apparatus; and when the microphone is not detected as being coupled to the audio apparatus, enabling a microphone mute function to exclude the first audio data from the output audio data.

The present invention is more specifically described in the following paragraphs by reference to the drawings attached only by way of example. Other advantages and features will become apparent from the following description and from the claims.

BRIEF DESCRIPTION OF THE DRAWINGS

In the accompanying drawings, which are incorporated in and constitute a part of this specification, embodiments of the invention are illustrated, which, together with a general description of the invention given above, and the detailed description given below, serve to exemplify the principles of this invention.

DETAILED DESCRIPTION OF PREFERRED EMBODIMENT

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of this invention. Accordingly, the description which follows is to be understood as being a broad, teaching disclosure directed to persons of skill in the appropriate arts, and not as limiting upon the present invention.

An early computer system only has basic computer functions. However, a more modern computer system can have multiple functions such as data communication, audio refresh, and dynamic image refresh. Such a modern computer system can be referred to as a "multimedia computer system."

Figure 1:
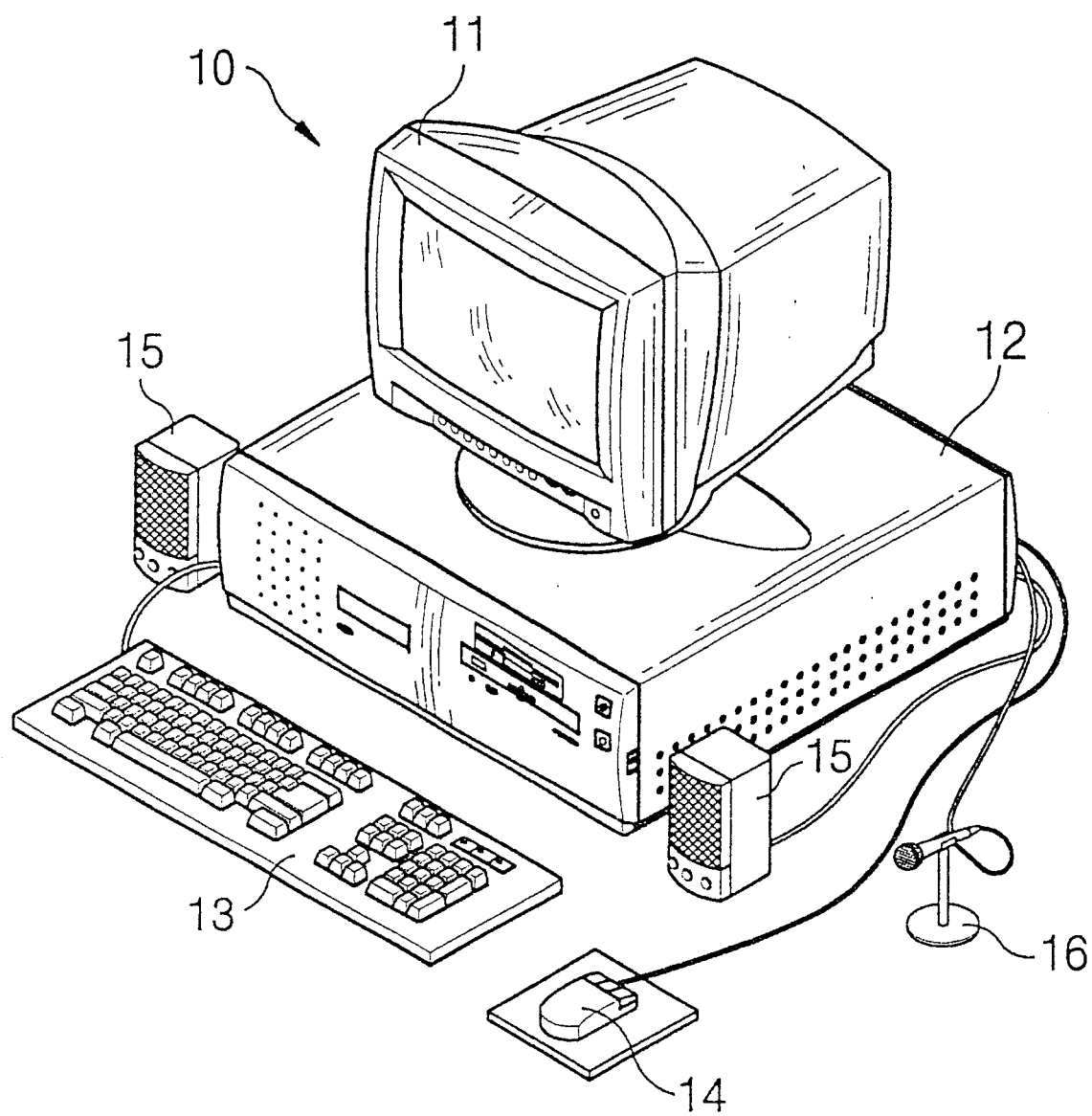
FIG. 1 is a perspective view illustrating a multimedia computer system.

FIG. 1 illustrates a multimedia computer system. Referring to FIG. 1, a multimedia computer system 10 includes a display monitor 11, a computer body 12, a keyboard 13, and a mouse 14. The computer system 10 may further includes a speaker 15 and a microphone 16 for voice input.

Figure 2:
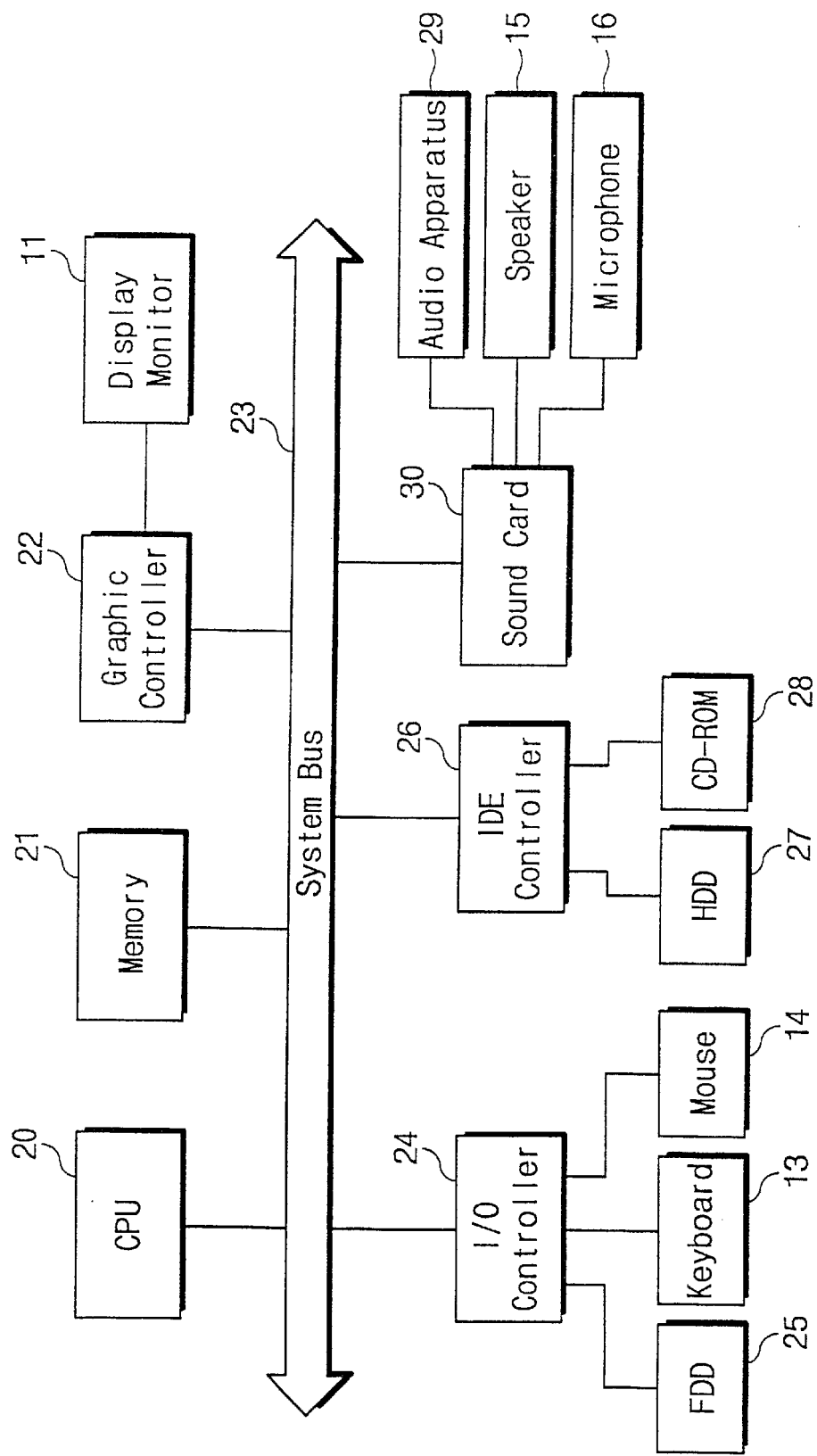
FIG. 2 is a block diagram illustrating circuit configuration of a computer system shown in FIG. 1.

FIG. 2 illustrates circuit configuration of a computer system shown in FIG. 1. Referring to FIG. 2, a central processing unit (CPU) 20, a memory 21, a graphic controller 22, an input/output (I/O) controller 24, an integrated drive electronics (IDE) controller 26, and a sound card 30 are connected to a system bus 23 in the multimedia computer system 10. A display monitor 11 is connected to the graphic controller 22. A floppy disk driver (FDD) 25, a keyboard 13, and a sound card 30 are connected to the I/O controller 24. A hard disk driver (HDD) 27 and a compact disk-read only memory (CD-ROM) 28 are connected to the integrated drive electronics controller 26. A speaker 15 and a microphone 16 are connected to the sound card 30. Further, a separate audio apparatus 29 may be connected to the sound card 30. Multimedia apparatuses may be further mounted, for example, a video overlay card.

The sound card 30 mounted in the multimedia computer system 10 is operated in accordance with control of an audio application program mounted in a system, thereby outputting an audio signal or voice inputted by means of the microphone 16 through the speaker 15. Further, the audio signal may be outputted through a separate audio apparatus 29.

I have found that users of a sound card rarely use a microphone. The sound card is one example of an audio device. The sound card is chiefly used in midi, wave, and compact disk (CD) audio refresh. If a microphone is not connected to a microphone jack (not shown), the sound card makes a "white noise." Since the white noise is outputted with noises made in outputting other audio signals, tone quality becomes bad during audio refresh. A microphone mute function interrupting microphone input is exerted to interrupt the white noise. However, a user should control the operation one by one.

Hereinafter, a preferred embodiment of the present invention will be described in detail with reference to the attached drawings. A sound card of the invention has a microphone detector capable of detecting whether or not a microphone is connected. If the microphone is not connected to a sound card, microphone mute function is exerted to reduce white noise. Consequently, audio refresh of good quality can be realized.

Figure 3:
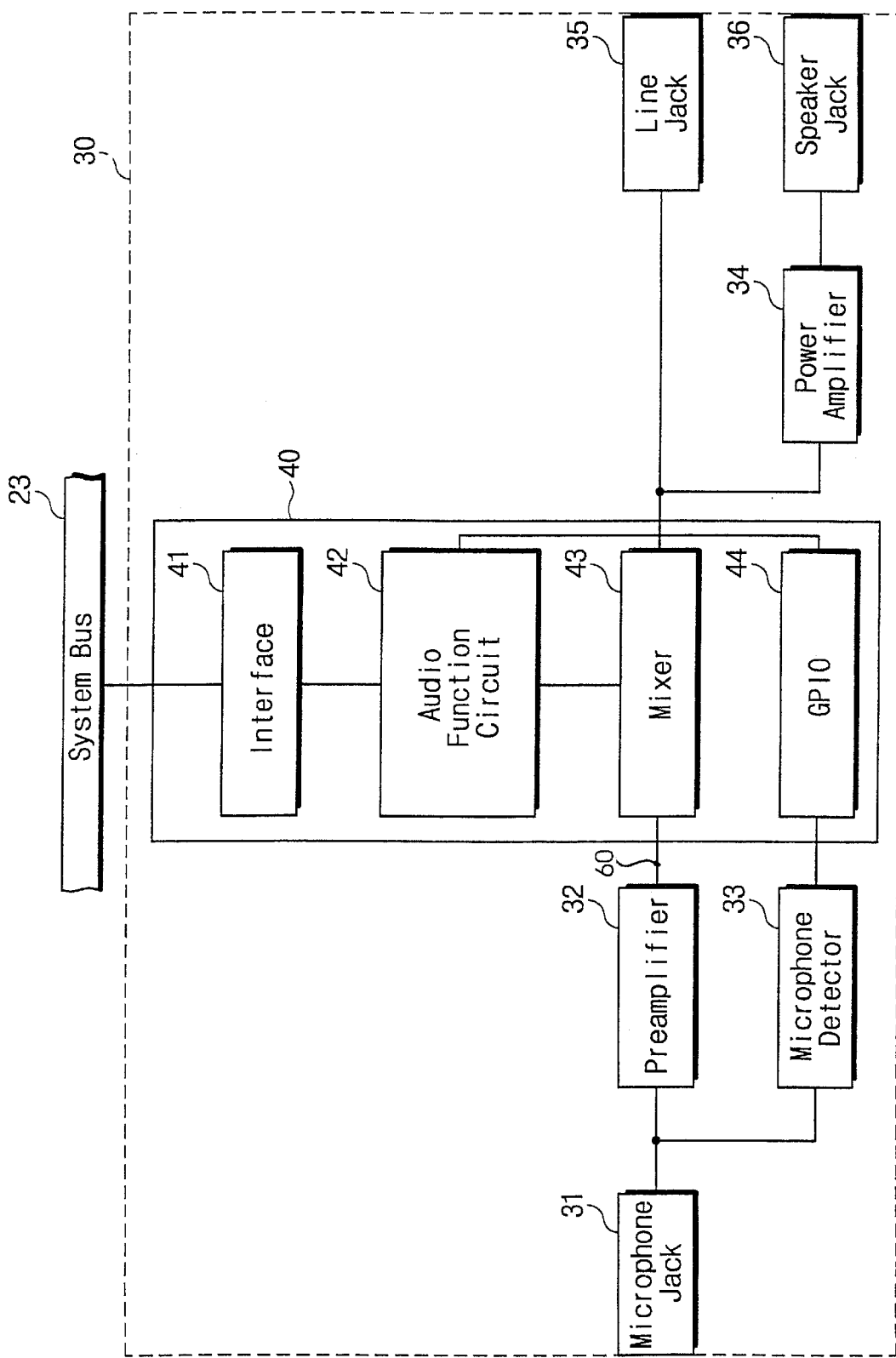
FIG. 3 is a block diagram illustrating circuit configuration of a sound card, in accordance with the principles of the preset invention.

FIG. 3 illustrates circuit configuration of a sound card according to the present invention. Referring to FIG. 3, a sound card 30 includes an audio chipset 40. The audio chipset 40 includes an interface 41, an audio function circuit 42, a mixer 43, and a general purpose input/output (GPIO) 44. The interface 41 interfaces data input/output between a system bus 23 and the audio function circuit 42. The audio function circuit 42 controls general operation of an audio chipset and, especially, is responsible for audio treatment such as audio refresh and recording. The mixer 43 mixes many audio sources and then outputs the sources.

Figure 4:
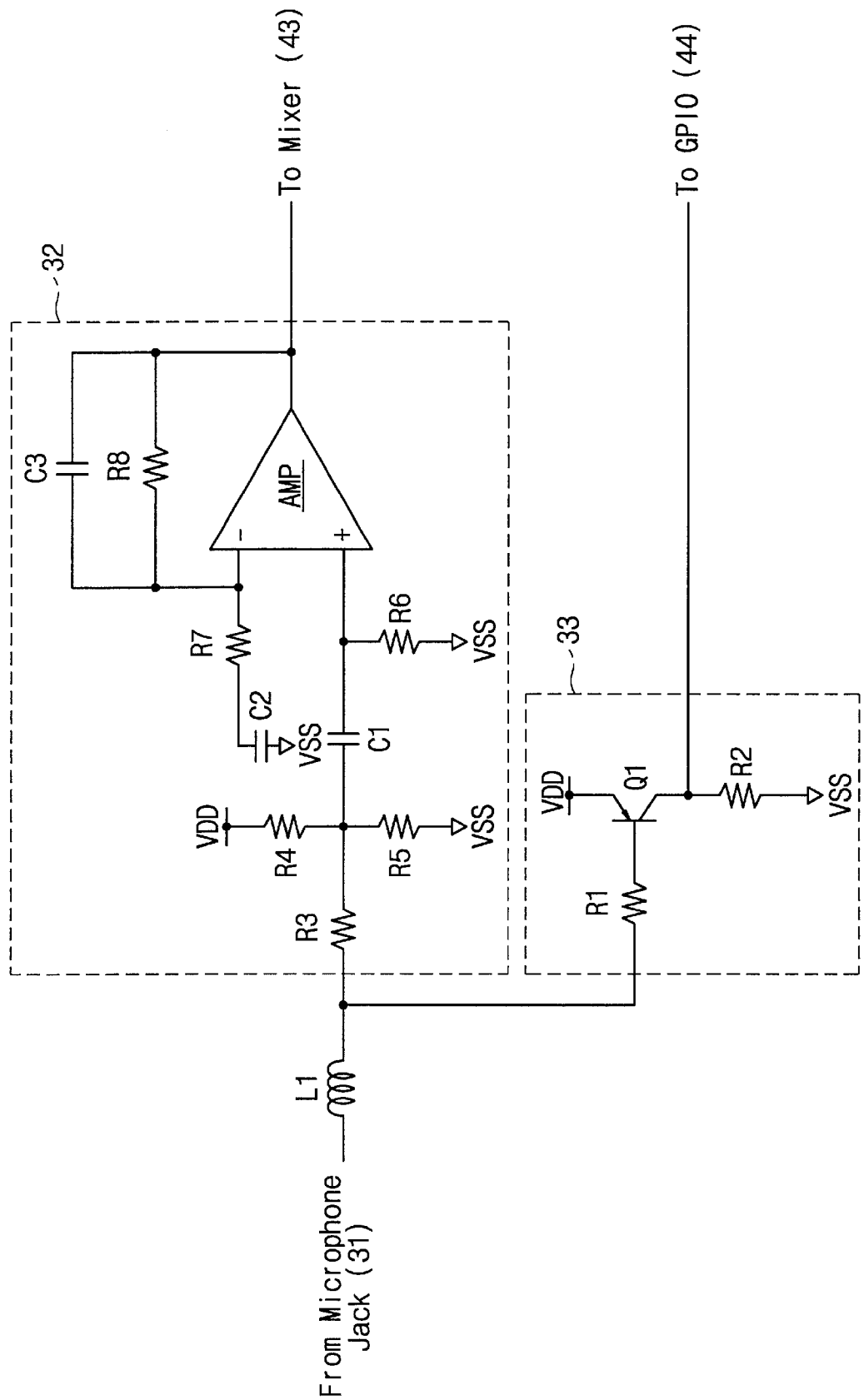
FIG. 4 is a detailed diagram illustrating circuit configuration of a preamplifier and a microphone detector shown in FIG. 3, in accordance with the principles of the preset invention.

Moreover, the sound card includes a microphone jack 31, a preamplifier 32, a microphone detector 33, a power amplifier 34, a line jack 35, and a speaker jack 36. The preamplifier 32 preamplifies a voice signal inputted from a microphone 16 connected to the microphone jack 31 and then inputs the voice signal through terminal 60 to the mixer 43. According to circumstances, the preamplifier 32 may be embedded in the audio chipset 40. The microphone detector 33 detects the microphone 16 being connected to the microphone jack 32. If the microphone 16 is connected thereto, the microphone detector 33 supplies a detection signal to the general purpose input/output 44. The power amplifier 34 amplifies an audio signal and then outputs the signal to a speaker 15 connected to a speaker jack 36 as well as to an audio apparatus 29 connected to the line jack 35. FIG. 4 illustrates a detailed circuit diagram of a preamplifier and a microphone detector shown in FIG. 3. Referring to FIG. 4, an inductor L1 (not shown in FIG. 3) for filtering input noise is placed between a microphone jack 31 and a preamplifier 32. The preamplifier 32 comprises resistances R1–R8, capacitors C1–C3, and an amplifier AMP. One edge of the resistance R3 is connected to the inductor L1. One edge of the resistance R4 is connected to the other edge of the resistance R3 and the other edge of the resistance R4 is connected to power supply voltage $V_{DD}$. One edge of the resistance R5 is connected to the other edge of the resistance R3 and the other edge of the resistance R5 is connected to ground voltage $V_{SS}$. One edge of the capacitor C1 is connected to the other edge of the resistance R3. One edge of the resistance R6 is connected to the other edge of the capacitor C1 and the other edge of the resistance R6 is connected to the ground voltage $V_{SS}$. The other edge of the capacitor C1 is connected to a non-inversion input terminal of the amplifier AMP. An output terminal of the amplifier AMP is connected to the mixer 43. One edge of the resistance R7 is connected to an inversion input terminal of the amplifier AMP. A capacitor C2 is connected between the other edge of the resistance R7 and the ground voltage $V_{SS}$. The resistance R8 and the capacitor C3 are connected between an inversion input terminal of the amplifier AMP and an output terminal thereof in parallel. If a voice signal is inputted through the microphone jack 31 and then is preamplified by the amplifier AMP, the preamplifier 32 inputs a preamplified voice signal to the mixer 43.

The microphone detector 33 comprises resistances R1 and R2, and a PNP-type transistor Q1. One edge of the resistance R1 is connected to the inductor L1. A base of the transistor Q1 is connected to the resistance R1 and an emitter of the transistor Q1 is connected to the power supply voltage $V_{DD}$. The resistance R2 is connected between a collector of the transistor Q1 and the ground voltage $V_{SS}$. The collector of the transistor Q1 is connected to a general purpose input (GPI) of the general purpose input/output 44. If the microphone 16 is connected to a microphone jack 31 and then the transistor Q1 is turned off, the microphone detector 33 inputs a low level signal to an input terminal of the general purpose input/output 44. If the microphone 16 is not connected thereto, the microphone detector 33 outputs a high level signal.

As mentioned above, the microphone detector 33 detects the microphone 16 being connected to the microphone jack 31. The audio application program can control the audio mute function in accordance with whether or not the microphone is connected.

Figure 5:
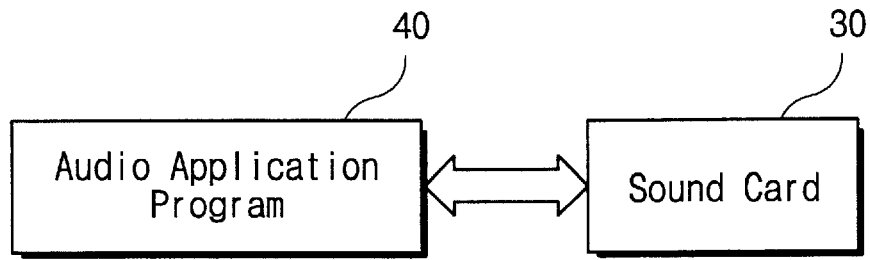
FIG. 5 is a diagram illustrating an audio application program controlling a sound card, in accordance with the principles of the preset invention.

FIG. 5 illustrates the fact that an audio application program controls a sound card. Referring to FIG. 5, an audio application program 40 periodically accesses a sound card 30 and supervises whether a microphone 16 is connected.

Figure 6:
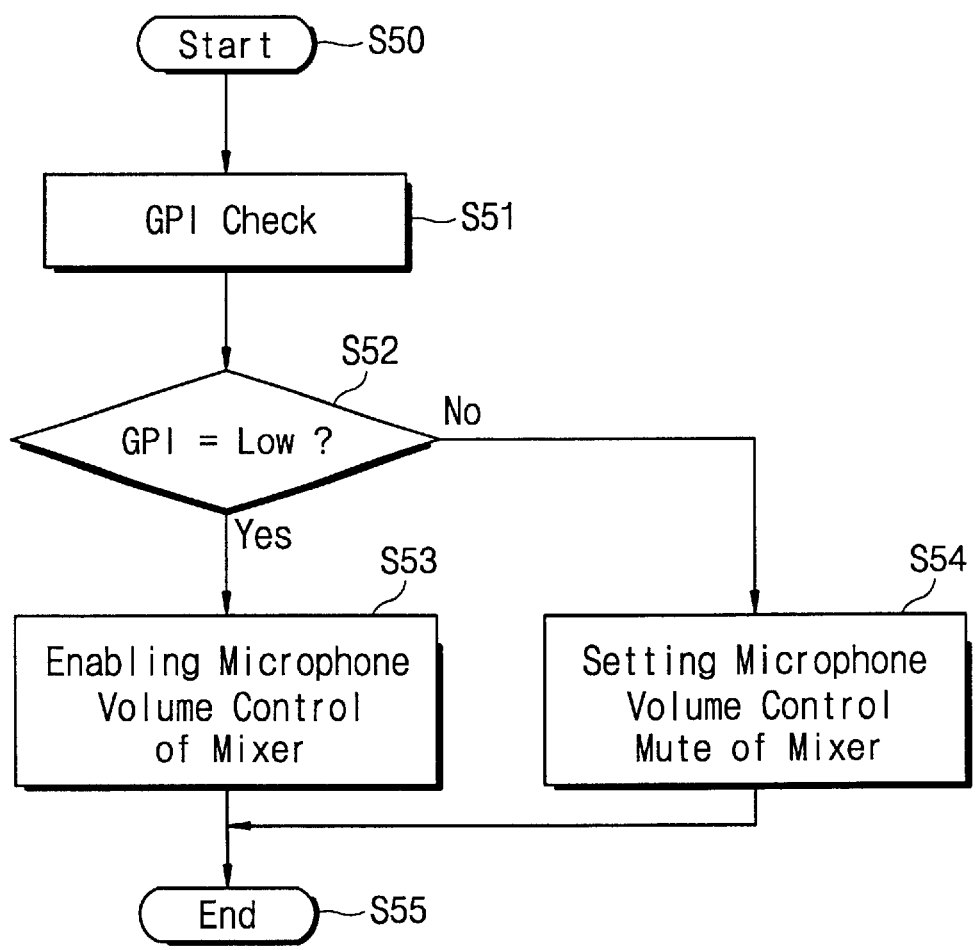
FIG. 6 is a flow chart illustrating the steps of controlling a sound card in an application program shown in FIG. 5, when a microphone is connected and when a microphone is not connected, in accordance with the principles of the preset invention.

FIG. 6 illustrates the steps of controlling a sound card, whether a microphone is connected or not, in an audio application program shown in FIG. 5. Referring to FIG. 6, in step S50, the control for periodic supervision of microphone connection is started. In step S51, the invention checks the voltage level of an input terminal in which the microphone detector 33 is connected to the general purpose input/output 44. In step S52, the invention determines whether the input terminal is lower level. That is, the invention determines whether the microphone 16 is connected. If the microphone 16 is connected, the step S52 proceeds to a step S53. In step S53, the sound card 30 is controlled and the microphone volume control function is enabled. If the microphone 16 is not connected, the step S52 proceeds to a step S54. In step S54, microphone volume control of the mixer 43 is disabled to exert the microphone mute function. In step S55, a microphone connection supervision routine is ended.

An audio apparatus of this invention automatically detects whether a microphone is connected, or is not connected, to a sound card, which allows a microphone mute function of a sound card to be exerted to reduce white noise. It is therefore possible to realize the audio refresh of high quality, although a microphone is not connected to a sound card.

While the present invention has been illustrated by the description of embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details, representative apparatus and method, and illustrative examples shown and described. Accordingly, departures may be made from such details without departing from the spirit or scope of the applicant's general inventive concept.

What is claimed is:

1. An apparatus, comprising:
   an audio device having a terminal removably coupled to a microphone;
   a detector detecting when the microphone is coupled to said terminal and outputting a detection signal in accordance with said detecting;
   a mixing unit receiving first audio data from said audio device and outputting second audio data; and
   a control unit controlling said mixing unit in accordance with said detection signal, muting the first audio data when the microphone is not coupled to said terminal, not muting the first audio data when the microphone is coupled to said terminal.

2. The apparatus of claim 1, said apparatus corresponding to a computer system.

3. The apparatus of claim 1:
the second audio data including the first audio data when the microphone is coupled to said terminal, the second audio data not including the first audio data when the microphone is not coupled to said terminal.

4. An apparatus, comprising:
an audio device having a terminal removably coupled to a microphone;
a detector detecting when the microphone is coupled to said terminal; and
a mixing unit receiving first audio data from said audio device and outputting second audio data, said mixing unit muting the first audio data when said detector detects that the microphone is not coupled to said terminal, said mixing unit not muting the first audio data when said detector detects that the microphone is coupled to said terminal.

5. The apparatus of claim 4:
the second audio data including the first audio data when the microphone is coupled to said terminal, the second audio data not including the first audio data when the microphone is not coupled to said terminal.

6. The apparatus of claim 4, said apparatus corresponding to a computer system.

7. The apparatus of claim 4, further comprising a computer system being coupled to said apparatus.

8. An audio apparatus mounted on a computer system, comprising:
a connector removably coupling a microphone to a terminal of an audio device;
a detector detecting when the microphone is coupled to said connector and outputting a detection signal in accordance with said detecting;
a mixing unit receiving first audio data from said audio device and outputting second audio data; and
a control unit controlling said mixing unit in accordance with said detection signal, said control unit preventing the first audio data from being included with the second audio data when said detection signal indicates that the microphone is not coupled to said connector, said control unit not preventing the first audio data from being included with said second audio data when said detection signal indicates that the microphone is coupled to said connector.

9. The apparatus of claim 8, said detector further comprising:
a first resistor having a first and a second end, said first end of said first resistor being coupled to said connector;
a transistor having a control electrode coupled to said second end of said first resistor, a first electrode of a principal electrically conducting channel coupled to a power supply voltage, and a second electrode of said principal electrically conducting channel;
a second resistor having a first and a second end, said first end of said second resistor being coupled to said second electrode of said transistor, said second end of said second resistor being coupled to a local reference potential; and
said first end of said second resistor outputting said detection signal.

10. The apparatus of claim 9, said detection signal corresponding to a logic low signal when the microphone is coupled to said connector, said detection signal corresponding to a logic high signal when the microphone is not coupled to said connector.

11. The apparatus of claim 9, further comprising:
an audio unit coupling said connector to the terminal, said audio unit further comprising:
a third resistor having a first and a second end, said first end being coupled to said connector;
a fourth resistor having a first and a second end, said first end of said fourth resistor being coupled to the power supply voltage, said second end of said fourth resistor being coupled to said second end of said third resistor;
a fifth resistor having a first and a second end, said first end of said fifth resistor being coupled to said second end of said third resistor, said second end of said fifth resistor being coupled to the local reference potential;
a first capacitor having a first and a second end, said first end of said first capacitor being coupled to said second end of said third resistor;
a sixth resistor having a first and a second end, said first end of said sixth resistor being coupled to said second end of said first capacitor, said second end of said sixth resistor being coupled to the local reference potential;
an amplifier having a non-inverting input port, an inverting input port, and an output port, said non-inverting input port being coupled to said second end of said first capacitor;
a seventh resistor having a first and a second end, said first end of said seventh resistor being coupled to said inverting input port;
a second capacitor having a first and a second end, said first end of said second capacitor being coupled to said second end of said seventh resistor, said second end of said second capacitor being coupled to the local reference potential;
a third capacitor having a first and a second end, said first end of said third capacitor being coupled to said inverting input port of said amplifier, said second end of said third capacitor being coupled to said output port of said amplifier;
an eighth resistor having a first and a second end, said first end of said eighth resistor being coupled to said inverting input port of said amplifier, said second end of said eighth resistor being coupled to said output port of said amplifier; and
said output port of said amplifier outputting the first audio data to said mixing unit.

12. A method, comprising:
detecting when a microphone is in communication with a terminal of an audio device coupled to an audio apparatus;
when the microphone is detected as being in communication with the terminal of the audio device, enabling a microphone volume control function to include first audio data received from the audio device with output audio data output from the audio apparatus; and
when the microphone is not detected as being coupled to the audio apparatus, enabling a microphone mute function to exclude the first audio data from the output audio data.

13. The method of claim 12, said microphone volume control function controlling a sensitivity to audio signals being input to the microphone.

14. The method of claim 12, further comprising when the microphone is detected as being in communication with the terminal of the audio device, conveying the first audio data to a mixer mounted in the audio apparatus, said mixer outputting the output audio data including the first audio data.

15. The method of claim 12, further comprising the audio apparatus being mounted on a computer system.

16. The method of claim 12, further comprising:

said detecting when the microphone is in communication with the terminal of the audio device corresponding to determining when a connector couples the microphone to the terminal, said determining being performed by a detector;

transmitting a detection signal in accordance with said determining, said transmitting being performed by the detector; and receiving the first audio data from the audio device and outputting the output audio data, said receiving and said outputting being performed by a mixing unit.

17. The method of claim 16, further comprising:

controlling the mixing unit in accordance with the detection signal;

when the detection signal indicates that the connector is not coupling the microphone to the terminal, preventing the mixing unit from including the first audio data with the output audio data;

when the detection signal indicates that the connector is not coupling the microphone to the terminal, not preventing the mixing unit from including the first audio data with the output audio data.

18. The method of claim 17, further comprising:

coupling a first resistor having a first and a second end, said first end of said first resistor being coupled to the connector;

coupling a transistor having a control electrode coupled to said second end of said first resistor, a first electrode of a principal electrically conducting channel coupled to a power supply voltage, and a second electrode of said principal electrically conducting channel;

coupling a second resistor having a first and a second end, said first end of said second resistor being coupled to said second electrode of said transistor, said second end of said second resistor being coupled to a local reference potential; and outputting the detection signal from said first end of said second resistor.

19. The method of claim 18, further comprising:

the detection signal corresponding to a logic low signal when the microphone is coupled to the connector; and the detection signal corresponding to a logic high signal when the microphone is not coupled to the connector.

20. The method of claim 19, further comprising:

coupling a third resistor having a first and a second end, said first end being coupled to the connector;

coupling a fourth resistor having a first and a second end, said first end of said fourth resistor being coupled to the power supply voltage, said second end of said fourth resistor being coupled to said second end of said third resistor;

coupling a fifth resistor having a first and a second end, said first end of said fifth resistor being coupled to said second end of said third resistor, said second end of said fifth resistor being coupled to the local reference potential;

coupling a first capacitor having a first and a second end, said first end of said first capacitor being coupled to said second end of said third resistor;

coupling a sixth resistor having a first and a second end, said first end of said sixth resistor being coupled to said second end of said first capacitor, said second end of said sixth resistor being coupled to the local reference potential;

coupling an amplifier having a non-inverting input port, an inverting input port, and an output port, said non-inverting input port being coupled to said second end of said first capacitor;

coupling a seventh resistor having a first and a second end, said first end of said seventh resistor being coupled to said inverting input port;

coupling a second capacitor having a first and a second end, said first end of said second capacitor being coupled to said second end of said seventh resistor, said second end of said second capacitor being coupled to the local reference potential;

coupling a third capacitor having a first and a second end, said first end of said third capacitor being coupled to said inverting input port of said amplifier, said second end of said third capacitor being coupled to said output port of said amplifier;

coupling an eighth resistor having a first and a second end, said first end of said eighth resistor being coupled to said inverting input port of said amplifier, said second end of said eighth resistor being coupled to said output port of said amplifier; and outputting the first audio data to said mixing unit from said output port of said amplifier.

* * * * *